United States Patent [19]
Keeth

[11] Patent Number: 5,949,254
[45] Date of Patent: Sep. 7, 1999

[54] ADJUSTABLE OUTPUT DRIVER CIRCUIT

[75] Inventor: Brent Keeth, Boise, Id.

[73] Assignee: Micron Technology, Inc., Boise, Id.

[21] Appl. No.: 08/757,738

[22] Filed: Nov. 26, 1996

[51] Int. Cl.$^6$ .............................................. H03K 19/0185
[52] U.S. Cl. ................................ 326/87; 326/27; 326/83
[58] Field of Search .................................. 326/26, 27, 30, 326/50, 86, 87; 327/380, 381

[56] References Cited

U.S. PATENT DOCUMENTS

| | | |
|---|---|---|
| 4,096,402 | 6/1978 | Schroeder et al. . |
| 4,183,095 | 1/1980 | Ward ........................................ 326/86 |
| 4,404,474 | 9/1983 | Dingwall . |
| 4,638,187 | 1/1987 | Boler et al. . |
| 4,789,796 | 12/1988 | Foss . |
| 4,829,199 | 5/1989 | Prater . |
| 4,888,498 | 12/1989 | Kadakia . |
| 4,958,088 | 9/1990 | Farah-Bakhsh et al. . |
| 4,961,010 | 10/1990 | Davis ....................................... 326/87 |
| 4,984,204 | 1/1991 | Sato et al. . |
| 4,992,676 | 2/1991 | Gerosa et al. ............................ 326/87 |
| 5,111,075 | 5/1992 | Ferry et al. .............................. 326/87 |
| 5,122,690 | 6/1992 | Bianchi . |
| 5,128,560 | 7/1992 | Chern et al. ............................. 307/475 |
| 5,128,563 | 7/1992 | Hush et al. .............................. 307/482 |
| 5,134,311 | 7/1992 | Biber et al. . |
| 5,150,186 | 9/1992 | Pinney et al. . |
| 5,165,046 | 11/1992 | Hesson . |
| 5,179,298 | 1/1993 | Hirano et al. . |
| 5,194,765 | 3/1993 | Dunlop et al. . |

(List continued on next page.)

FOREIGN PATENT DOCUMENTS

| | | |
|---|---|---|
| 0 382 124 A2 | 8/1990 | European Pat. Off. . |
| 0 450 871 A2 | 10/1991 | European Pat. Off. . |
| 0 599 631 A1 | 6/1994 | European Pat. Off. . |
| 0 655 741 A2 | 5/1995 | European Pat. Off. . |
| 0 680 049 A2 | 11/1995 | European Pat. Off. . |
| 2-112317 | 4/1990 | Japan . |
| 4-90620 | 3/1992 | Japan ..................................... 326/27 |
| 5-136664 | 1/1993 | Japan . |
| 05282868 | 10/1993 | Japan . |
| 0 632 659 0 | 11/1994 | Japan . |
| WO 96/10866 | 4/1996 | WIPO . |

OTHER PUBLICATIONS

Descriptive literature entitled, "400MHz SLDRAM, 4M×16 SLDRAM Pipelined, Eight Bank, 2.5 V Operation," SLDRAM Consortium Advance Sheet, published throughout the Unites States, pp. 1–22.

"Draft Standard for a High–Speed Memory Interface (SyncLink)," Microprocessor and Microcomputer Standards Subcommittee of the IEEE Computer Society, Copyright 1996 by the Institute of Electrical and Electronics Engineers, Inc. New York, NY, pp. 1–56.

Chapman, J. et al., "A Low–Cost High–Performance CMOS Timing Vernier for ATE", IEEE International Test Conference, Paper 21.2, 1995, pp. 459–468.

Ljuslin, C. et al., "An Integrated 16–channel CMOS Time to Digital Converter", IEEE Nuclear Science Symposium & Medical Imaging Conference Record, vol. 1, 1993, pp. 625–629.

Taguchi, M. et al., "A 40–ns 64–Mb DRAM with 64–b Parallel Data Bus Architecture", IEEE Journal of Solid–State Circuits, vol. 26, Nov. 1991, pp. 1493–1497.

*Primary Examiner*—Jon Santamauro
*Assistant Examiner*—Don Le
*Attorney, Agent, or Firm*—Seed and Berry LLP

[57] ABSTRACT

An output driver circuit offers wave-shaping and logic level adjustment for high speed data communications in a synchronous memory such as a dynamic random access memory (DRAM). Level adjustment is obtained by resistive division between a termination resistor and controllable impedances between an output node and VDD and VSS power supplies. Wave-shaping functions include slew rate modification of the signal at the output node, by sequentially turning on or off output transistors in response to a transition in an input signal. Different schemes of weighting the output transistors obtains different wave-shaping characteristics of the output signal.

18 Claims, 10 Drawing Sheets

U.S. PATENT DOCUMENTS

| | | |
|---|---|---|
| 5,220,208 | 6/1993 | Schenck . |
| 5,220,209 | 6/1993 | Seymour .................................. 326/87 |
| 5,239,206 | 8/1993 | Yanai . |
| 5,243,703 | 9/1993 | Farmwald et al. . |
| 5,254,883 | 10/1993 | Horowitz et al. ...................... 307/443 |
| 5,274,276 | 12/1993 | Casper et al. .......................... 307/443 |
| 5,276,642 | 1/1994 | Lee . |
| 5,278,460 | 1/1994 | Casper . |
| 5,281,865 | 1/1994 | Yamashita et al. . |
| 5,311,481 | 5/1994 | Casper et al. . |
| 5,321,368 | 6/1994 | Hoelzle . |
| 5,347,177 | 9/1994 | Lipp . |
| 5,347,179 | 9/1994 | Casper et al. . |
| 5,349,247 | 9/1994 | Hush et al. ............................. 307/451 |
| 5,355,391 | 10/1994 | Horowitz et al. . |
| 5,361,002 | 11/1994 | Casper . |
| 5,367,205 | 11/1994 | Powell .................................... 326/27 |
| 5,400,283 | 3/1995 | Raad . |
| 5,428,311 | 6/1995 | McClure ................................. 327/525 |
| 5,432,823 | 7/1995 | Gasbarro et al. . |
| 5,438,545 | 8/1995 | Sim . |
| 5,440,260 | 8/1995 | Hayashi et al. . |
| 5,451,898 | 9/1995 | Johnson . |
| 5,457,407 | 10/1995 | Shu et al. . |
| 5,473,575 | 12/1995 | Farmwald et al. . |
| 5,485,490 | 1/1996 | Leung et al. . |
| 5,488,321 | 1/1996 | Johnson . |
| 5,497,127 | 3/1996 | Sauer . |
| 5,498,990 | 3/1996 | Leung et al. . |
| 5,506,814 | 4/1996 | Hush et al. . |
| 5,508,638 | 4/1996 | Cowles et al. . |
| 5,513,327 | 4/1996 | Farmwald et al. . |
| 5,568,077 | 10/1996 | Sato et al. . |
| 5,574,698 | 11/1996 | Raad . |
| 5,576,645 | 11/1996 | Earwell . |
| 5,578,941 | 11/1996 | Sher et al. . |
| 5,581,197 | 12/1996 | Motley et al. . |
| 5,589,788 | 12/1996 | Goto . |
| 5,590,073 | 12/1996 | Arakawa et al. . |
| 5,602,494 | 2/1997 | Sundstrom ............................. 326/86 |
| 5,619,473 | 4/1997 | Hotta . |
| 5,621,340 | 4/1997 | Lee et al. . |
| 5,621,690 | 4/1997 | Jungroth et al. . |
| 5,627,780 | 5/1997 | Malhi . |
| 5,627,791 | 5/1997 | Wright et al. . |
| 5,631,872 | 5/1997 | Naritake et al. . |
| 5,636,163 | 6/1997 | Furutani et al. . |
| 5,636,173 | 6/1997 | Schaefer . |
| 5,636,174 | 6/1997 | Rao . |
| 5,638,335 | 6/1997 | Akiyama et al. . |
| 5,644,252 | 7/1997 | Watarai .................................. 326/30 |
| 5,661,416 | 8/1997 | Takada et al. ......................... 326/30 |
| 5,668,763 | 9/1997 | Fujioka et al. . |
| 5,694,065 | 12/1997 | Hamasaki et al. . |

ADJUSTABLE OUTPUT DRIVER CIRCUIT

FIELD OF THE INVENTION

This invention relates generally to integrated circuits and particularly to data put drivers for high speed data transmission.

BACKGROUND

Integrated circuits typically include a number of input/output pins which are used for communication with additional circuitry. For example, an integrated memory device such as a dynamic random access memory (DRAM) includes both control inputs for receiving memory operation control signals, and data pins for bi-directional data communication with an external system or processor.

The data transmission rate of modem integrated circuits is primarily limited by internal circuitry operating speeds. Communication networks can typically transmit signals between circuitry at a rate that is faster than the capacity of some integrated circuits. To address the need for faster circuits, a group of integrated circuits can be combined on a common bus. In this configuration, each integrated circuit operates in a coordinated manner with the other integrated circuits to share data that is transmitted at a high speed. For example, a group of memory devices, such as DRAMs, static RAMs, or read only memories (ROM), can be connected to a common data bus. The data rate of the bus may be substantially faster than the feasible operating speed of the individual memories. Each memory, therefore, is operated so that while one memory processes received data, another memory receives new data. By providing an appropriate number of memory devices and an efficient control system, very high speed data transmissions can be achieved.

As the transmission rate of the data communication signals continues to increase, new circuitry and methods are needed to accurately transmit data from each integrated circuit. One proposed solution is a bus driver described in U.S. Pat. No. 5,254,883. This bus driver circuit uses parallel output transistors that single-endedly couple the bus to a power supply. The output transistors are fabricated in different sizes and selectively activated to control the bus current. This approach is directed towards accurate bus current control to establish the bus voltage at an accurate logic voltage level. However, the approach lacks control over the transition of the bus voltage between logic voltage levels.

For the reasons stated above, and for other reasons stated below which will become apparent to those skilled in the art upon reading and understanding the present specification, there is a need in the art for a high speed output driver circuit which is fully adjustable, and offers control of the transition of the bus voltage between logic voltage levels.

SUMMARY

The present invention provides output driver circuit capable of wave-shaping and level adjustment of an output voltage signal. A first plurality of output transistors electrically couples or decouples an output node to a first power supply. A control circuit is coupled to a control terminal of each output transistor in the first plurality of output transistors. The control circuit sequentially turns on or off the output transistors in the first plurality of output transistors in response to a transition in a first input signal received by the control circuit.

In one embodiment, the output driver circuit includes a first impedance interposed between the first plurality of output transistors and the first power supply. A second plurality of output transistors electrically couples or decouples the output node to a second power supply. The control circuit is coupled to a control terminal of each output transistor in the second plurality of output transistors. The control circuit sequentially turns on or off the output transistors in the second plurality of output transistors in response to a transition in a second input signal received by the control circuit. The output driver circuit also includes a second impedance interposed between the first plurality of output transistors and the first power supply.

The present invention includes method and apparatus of wave-shaping a signal, including logic voltage levels and a slew rate of a voltage transition therebetween. The present invention is particularly useful for high speed data communications, such as in a synchronous memory including a dynamic random access memory (DRAM).

BRIEF DESCRIPTION OF THE DRAWINGS

In the drawings, like numerals describe substantially similar components throughout the several views.

DETAILED DESCRIPTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

Figure 1:
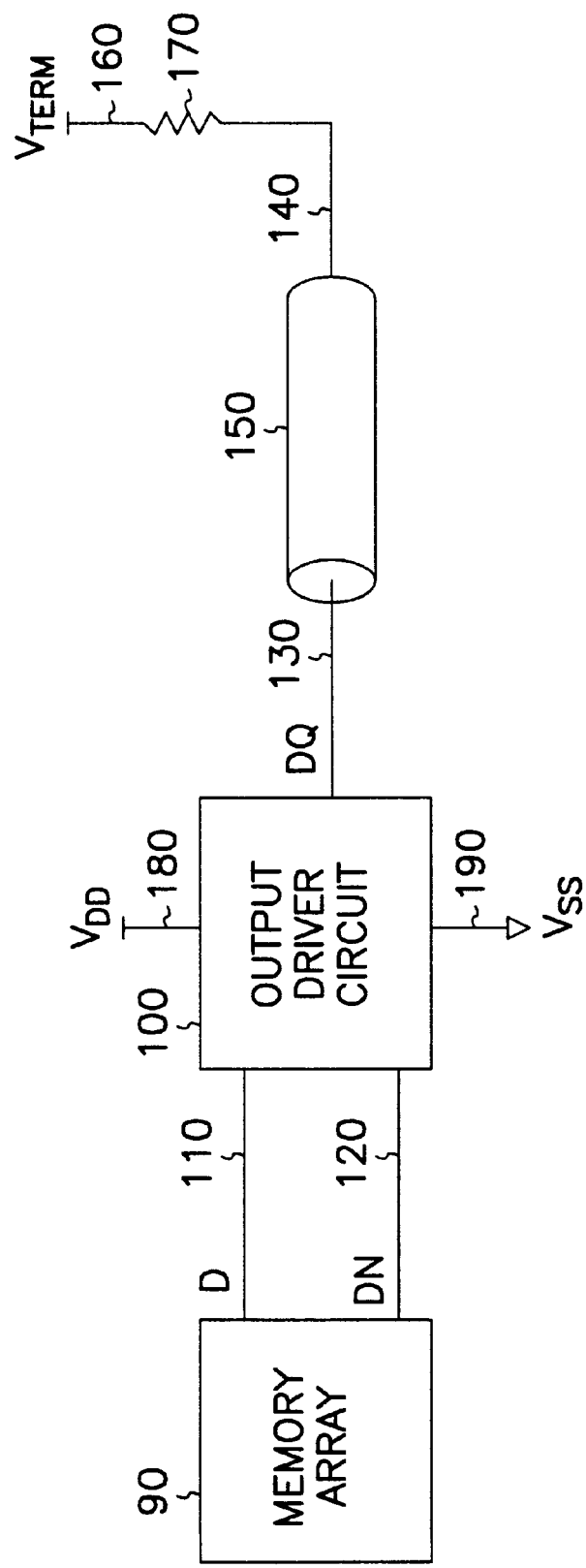
FIG. 1 is a generalized schematic illustration of one embodiment of the present invention and the environment in which it is used.

FIG. 1 is a generalized schematic illustration of one embodiment of the present invention and the environment in which it is used. In FIG. 1, memory array 90 includes memory cells and read circuitry for reading data stored in the memory cells. Output driver circuit 100 receives the data read from memory array 90 as first input signal D at node 110 and its binary complement, second input signal DN, at node 120, and provides in response thereto an output signal DQ at output node 130. Output node 130 is electrically coupled to receiving node 140 through data communication line 150, which may include distributed interconnect, pad, and other resistance and capacitance both on and off the integrated circuit chip. Output node 130 is also electrically coupled to a termination power supply voltage, $V_{term}$, at termination node 160 through termination resistor 170. First and second power supply voltages, such as $V_{DD}$ at node 180 and $V_{SS}$ at node 190 are provided to output driver circuit 100. $V_{term}$ is typically a voltage approximately midway between $V_{DD}$ and $V_{SS}$.

Figure 2:
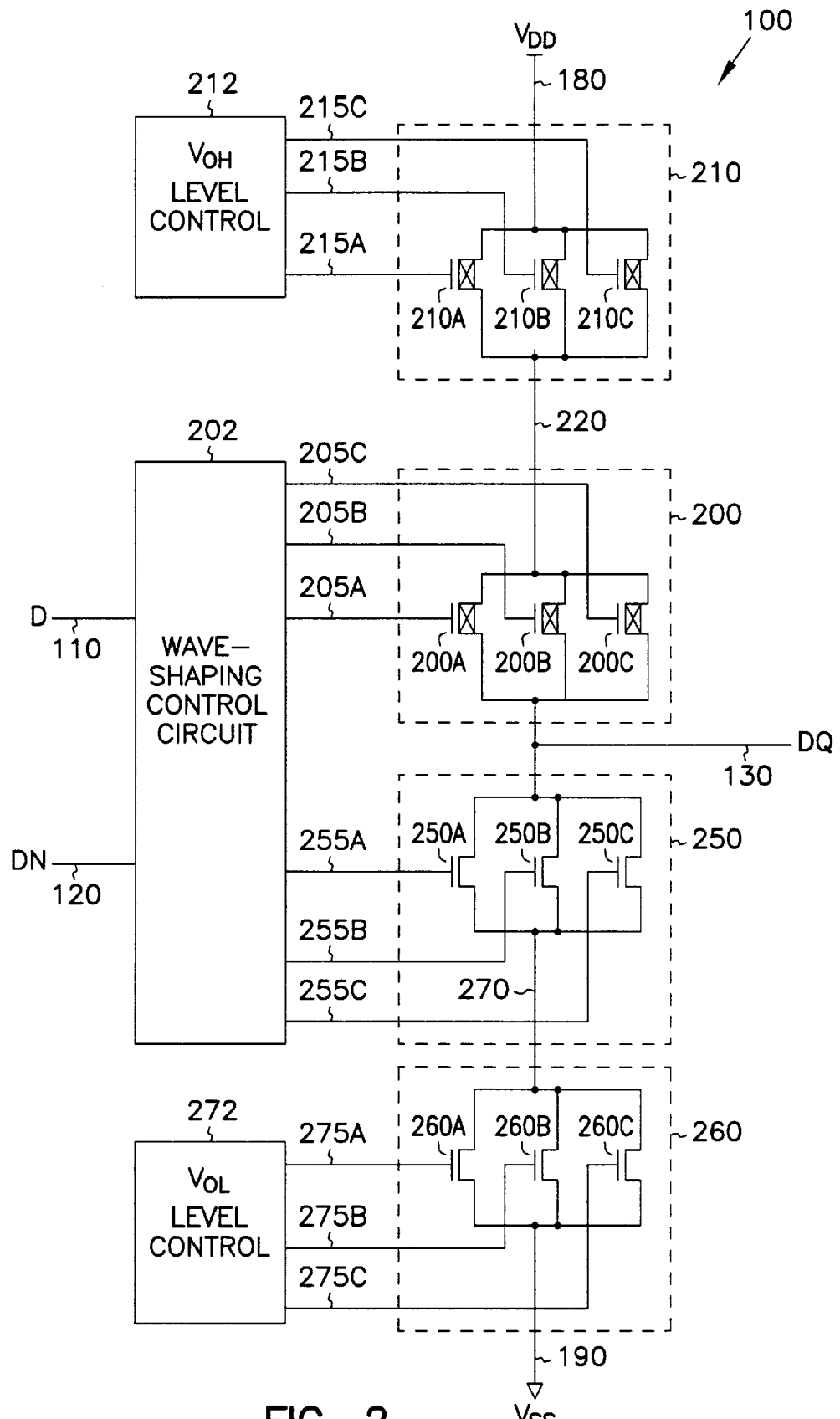
FIG. 2 is a generalized schematic illustration that illustrates in more detail one embodiment of the output driver circuit of FIG. 1.

FIG. 2 is a generalized schematic illustration that illustrates one embodiment of the output driver circuit 100 in more detail. In FIG. 2, a first plurality 200 of output transistors, such as PFETs 200A–C, have their drain terminals coupled together and to output node 130. Wave-shaping control circuit 202 provides independent control terminal signals at nodes 205A–C to the respective gate terminals of PFETs 200A–C. The source terminals of PFETs 200A–C are coupled together and to $V_{DD}$ through a first impedance 210.

In one embodiment, first impedance 210 comprises active devices such as PFETs 210A–C, having their drain terminals coupled together and to the source terminals at node 220 of each of PFETs 200A–C in the first plurality 200 of output transistors. PFETs 210A–C have their source terminals coupled together and to $V_{DD}$ at node 180. $V_{OH}$ level control circuit 212 provides independent control terminal signals at nodes 215A–C to the respective gate terminals of PFETs 210A–C to programmably control first impedance 210 by varying how many and which of PFETs 210A–C are turned on. Those of PFETs 210A–C that are turned on contribute to the effective value of the impedance between node 220 and $V_{DD}$ at node 180. PFETs 210A–C may have varying width/length aspect ratios, or may each comprise different multiples of instances of parallel-connected PFETs of the same width/length aspect ratio, or may otherwise be designed for optimizing the effective value of the impedance between node 220 and $V_{DD}$ at node 180 by permuting which of PFETs 210A–C are turned on.

Impedance 210 forms a resistive divider with termination resistor 170, the impedance values of which determine binary high logic voltage level, $V_{OH}$, at output node 130. $V_{OH}$ level control circuit 212, by controlling which of PFETs 210A–C are turned on, controls the value of impedance 210 and, in turn, controls the value of $V_{OH}$.

A second plurality 250 of output transistors, such as NFETs 250A–C, have their drain terminals coupled together and to output node 130. Wave-shaping control circuit 202 provides independent control terminal signals at nodes 255A–C to the respective gate terminals of NFETs 250A–C. The source terminals of NFETs 250A–C are coupled together and to $V_{SS}$ through a second impedance 260.

In one embodiment, second impedance 260 comprises active devices such as NFETs 260A–C, having their drain terminals coupled together and to the source terminals at node 270 of each of NFETs 250A–C in the second plurality 250 of output transistors. NFETs 260A–C have their source terminals coupled together and to $V_{SS}$ at node 190. $V_{OL}$ level control circuit 272 provides independent control terminal signals at nodes 275A–C to the respective gate terminals of NFETs 260A–C to programmably control impedance 260 by varying how many and which of NFETs 260A–C are turned on. Those of NFETs 260A–C that are turned on contribute to the effective impedance between node 270 and $V_{SS}$ at node 190. NFETs 260A–C may have varying width/length aspect ratios, or may each comprise different multiples of instances of parallel-connected NFETs of the same width/length aspect ratio, or may otherwise be designed for optimizing the effective impedance between node 270 and $V_{SS}$ at node 190 by permuting which of NFETs 260A–C are turned on.

Impedance 260 forms a resistive divider with termination resistor 170, the impedance values of which determine the binary low logic voltage level, $V_{OL}$, at output node 130. $V_{OL}$ level control circuit 272, by controlling which of NFETs 260A–C are turned on, controls the value of impedance 260 and, in turn, controls the value of $V_{OL}$.

In the above description first plurality 200 of output transistors, second plurality 250 of output transistors, first impedance 210, and second impedance 260 have each been described, for clarity of illustration, as comprising three field-effect transistors. However, it is understood that the exact number of said transistors may be selected according to individual design constraints without departing from the scope and spirit of the present invention.

Figure 3:
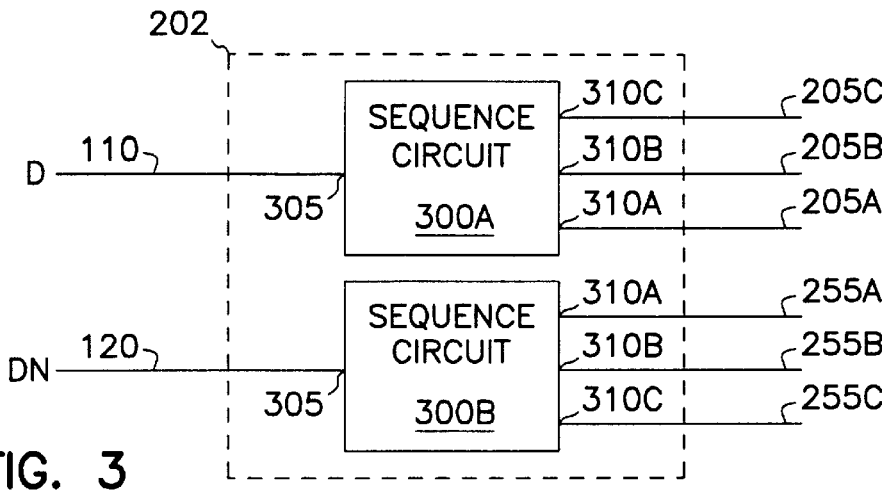
FIG. 3 is a generalized schematic illustration that illustrates the wave-shaping control circuit of FIG. 2 in more detail.

FIG. 3 is a generalized schematic illustration that illustrates wave-shaping control circuit 202 in more detail. Wave-shaping circuit 202 includes sequence circuits 300A–B receiving at respective first and second input signals D and DN at input terminals 305 that are electrically coupled to respective nodes 110 and 120. Sequence circuits 300A–B respectively provide, in response thereto, sequentially time-delayed control terminal signals at output terminals 310A–C that are electrically coupled to respective nodes 205A–C and 255A–C. The sequentially time-delayed control terminal signals effect coupling of output node 130 to respective $V_{DD}$ at node 180 and $V_{SS}$ at node 190 through respective first plurality 200 and second plurality 250 of output transistors. As will be described below, by providing sequentially delayed control terminal signals to the output transistors, sequence circuits 300A–B provide control over the slew rate of the voltage at output node 130, with the slew rate control being substantially independent of the $V_{OH}$ and $V_{OL}$ level control provided by first and second impedances 210 and 260, respectively.

Figure 4:
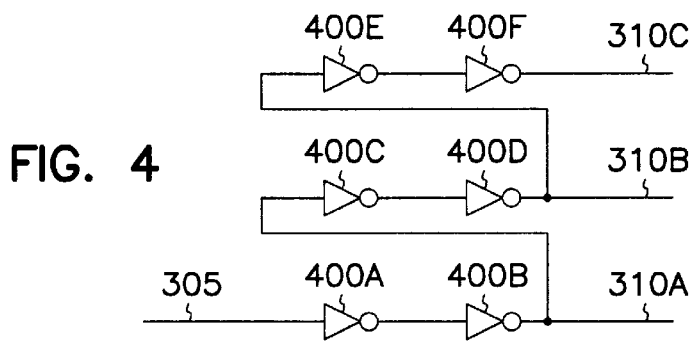
FIG. 4 is a generalized schematic illustration that illustrates one embodiment of each of sequence circuits of FIG. 3 in more detail.

FIG. 4 is a generalized schematic illustration that illustrates one embodiment of each of sequence circuits 300A–B in more detail. FIG. 4 includes a string of series-cascaded inverters 400A–F, for receiving an input signal at input terminal 305, and providing a number of sequentially delayed signals in response thereto at output terminals 310A–C. In this embodiment, the delay between the signal transition at the input terminal 305 and the signal transition at each of the output terminals 310A–C is determined by the inverter delays of the corresponding number of inverters therebetween, including interconnect capacitance and load capacitance of subsequent inverters and output transistors.

Figure 5:
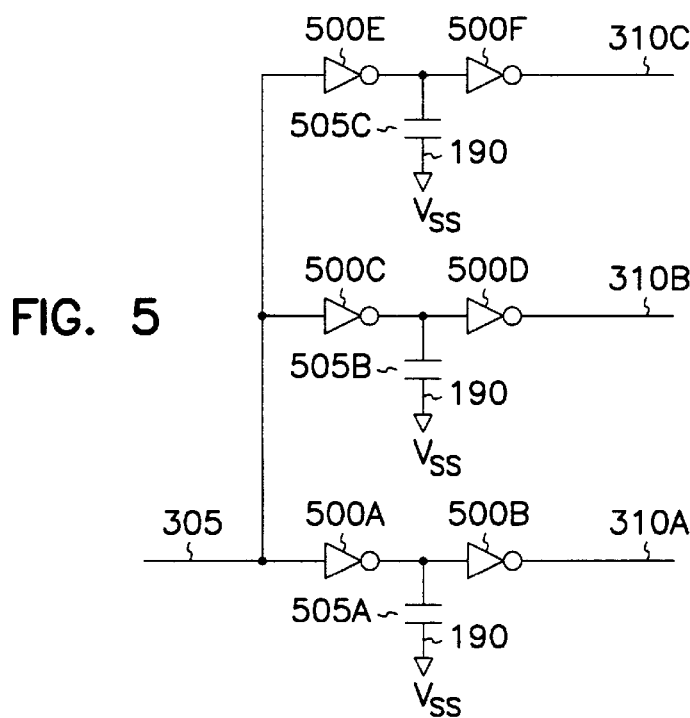
FIG. 5 is a generalized schematic illustration that illustrates another embodiment of each of sequence circuits of FIG. 3 in more detail.

FIG. 5 is a generalized schematic illustration that illustrates another embodiment of each of sequence circuits 300A–B in more detail. FIG. 5 includes pairs of series-cascaded inverters 500A–F. Each pair of inverters, such as pairs 500A–B, 500C–D, 500E–F, receives the input signal at input terminal 305 and provide a sequentially delayed signal in response thereto at respective output terminals 310A–C. Each pair of inverters, such as pairs 500A–B, 500C–D, 500E–F, has a capacitance interposed therebetween, such as respective capacitances 505A–C. The capacitances 505A–C are preferably trimmably adjustable, such as by fuse or other programmable elements, for tailoring the delays between the signal transition at the input terminal 305 and the signal transition at each of the output terminals 310A–C.

Figure 6:
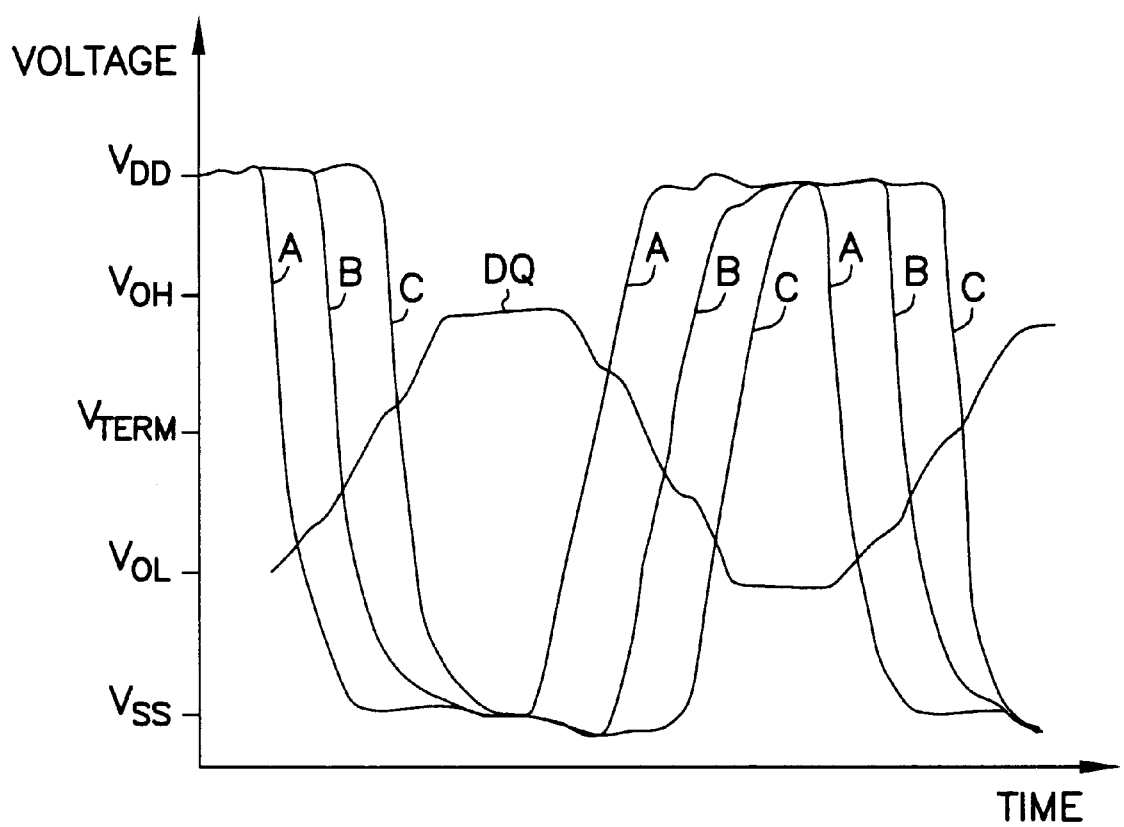
FIG. 6 is a graph illustrating the voltage vs. time waveforms of the output driver circuit of FIG. 2.

FIG. 6 is a graph illustrating the voltage vs. time waveforms of the output driver circuit 100. In FIG. 6, signal A represents the voltage waveform at nodes 205A and 255A, signal B represents the voltage waveform at nodes 205B and 255B, and signal C represents the voltage waveform at nodes 205C and 255C, and signal DQ represents the voltage waveform at node 130. Thus, FIG. 6 illustrates the slew-rate tailoring of transitions in the DQ signal in response to the sequentially delayed control terminal signals provided by wave-shaping control circuit 202. FIG. 6 also illustrates the reduced signal swing, i.e. $V_{OH}$ and $V_{OL}$ voltage levels, provided by impedances 210 and 260 in conjunction with terminating resistor 170. Providing an odd number of output transistors in each of the first plurality 200 and second plurality 250 of output transistors, avoids a plateau in signal DQ at the $V_{term}$ voltage.

Figure 7:
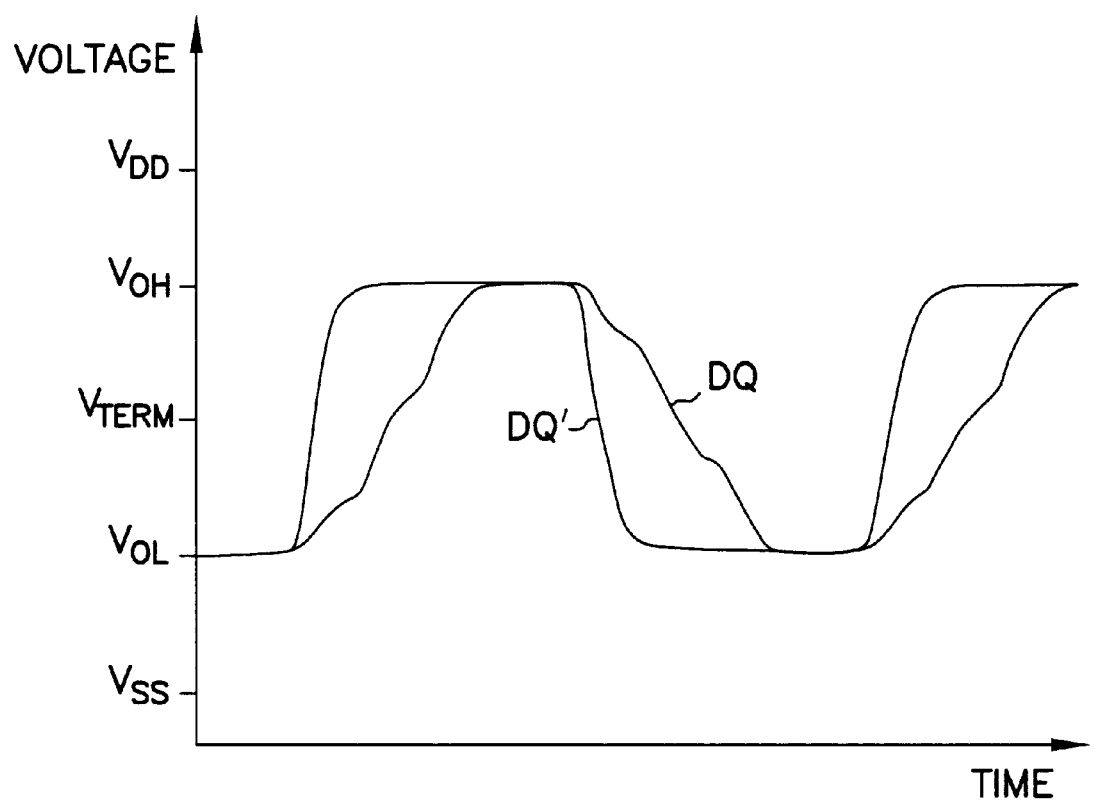
FIG. 7 is a graph illustrating the voltage vs. time waveform of the voltage DQ at the output node of the output driver circuit of FIG. 2 with respect to a voltage DQ' at the output node of a typical output driver circuit.

FIG. 7 is a graph illustrating the voltage vs. time waveform of the voltage DQ at output node 130 of output driver circuit 100 with respect to a voltage DQ' of a conventional output driver circuit without the slew-rate wave-shaping provided by the present invention. As seen in FIG. 7, the slew rate of voltage transitions of the voltage DQ according to the output driver circuit 100 of the present invention may be controlled more precisely that the voltage transitions of the voltage DQ' according to the conventional output driver circuit.

FIG. 7 illustrates the case wherein each of the output transistors in the first plurality 200 and second plurality 250 are equally weighted; their effective width/length aspect ratios are substantially identical. As seen in FIG. 7, this results in an approximately linear slew rate wave-shaping.

Figure 8:
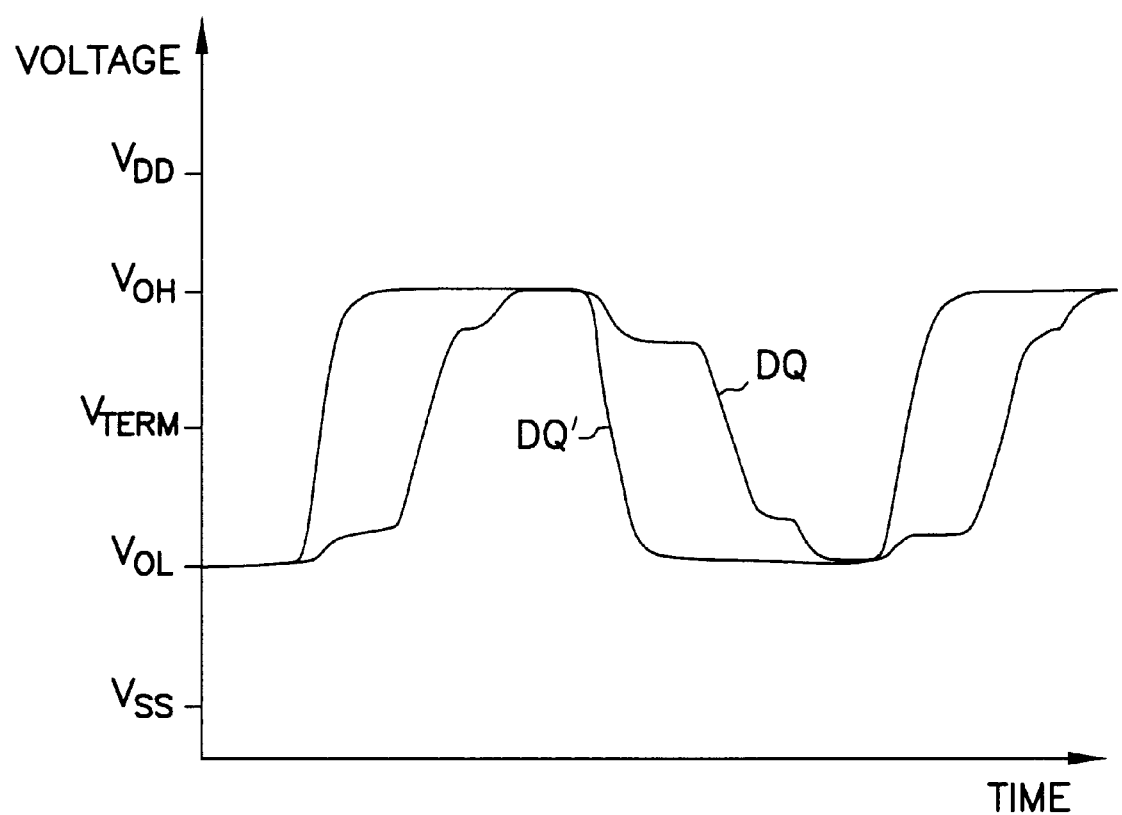
FIG. 8 is a graph, similar to FIG. 7, of waveforms resulting from a first unequal weighting of the output transistors.

FIG. 8 is a graph, similar to FIG. 7, in which the output transistors in the first plurality 200 and second plurality 250 of output transistors are not equally weighted. FIG. 8 illustrates the case where the intermediate transistors, such as 200B and 250B, have effective width/length aspect ratios that are larger than the effective width/length aspect ratios of the end transistors, such as 200A, 200C, 250A, and 250C. In this embodiment, the slew rate of the voltage DQ at output node 130 is faster near the midpoint between the $V_{OH}$ and $V_{OL}$ levels.

Figure 9:
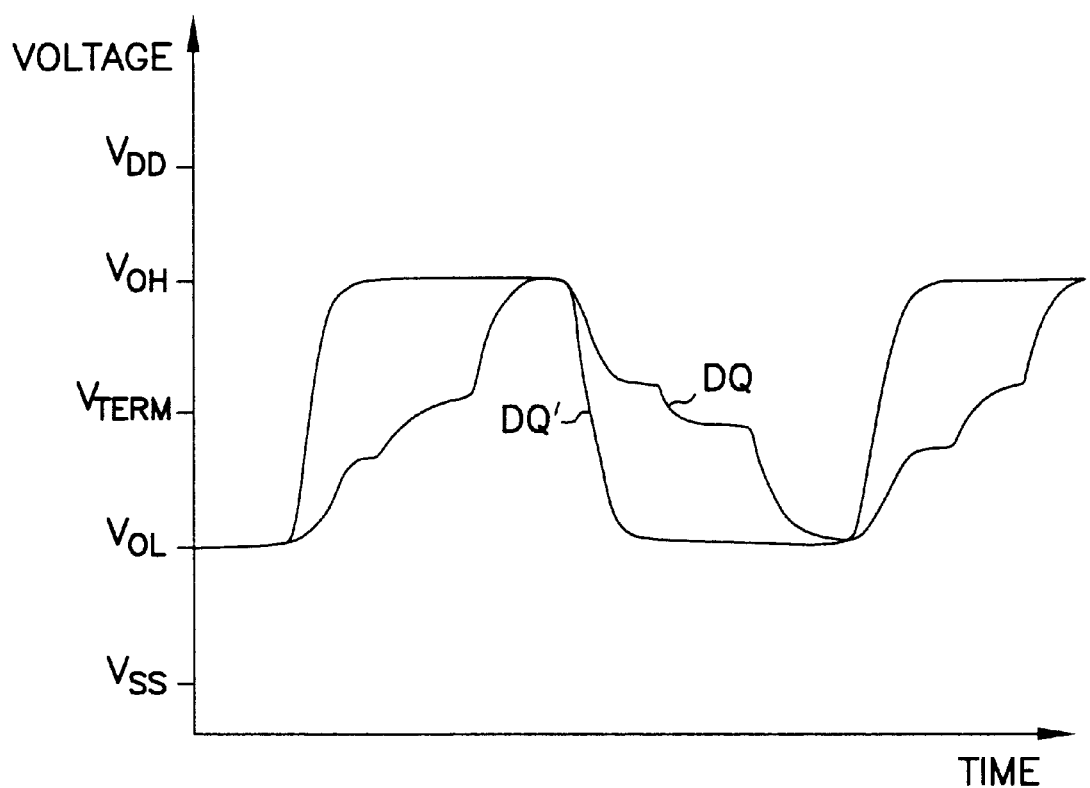
FIG. 9 is a graph, similar to FIG. 7, of waveforms resulting from a second unequal weighting of the output transistors.

FIG. 9 is a graph, similar to FIG. 7, in which the output transistors in the first plurality 200 and second plurality 250 of output transistors are not equally weighted. FIG. 9 illustrates the case where the intermediate transistors, such as 200B and 250B, have effective width/length aspect ratios that are smaller than the effective width/length aspect ratios of the end transistors, such as 200A, 200C, 250A, and 250C. In this embodiment, the slew rate of the voltage DQ at output node 130 is faster near the each of the $V_{OH}$ and $V_{OL}$ levels than near the midpoint between these two levels.

FIGS. 7-9 illustrate different approaches to weighting output transistors in each of the first plurality 200 and second plurality 250 of output transistors. Ones of the first plurality 200 of output transistors could also be weighted differently from ones of the second plurality 250 of output transistors; many combinations are possible in order to obtain the desired wave-shaping of the voltage DQ at output node 130.

Figure 10:
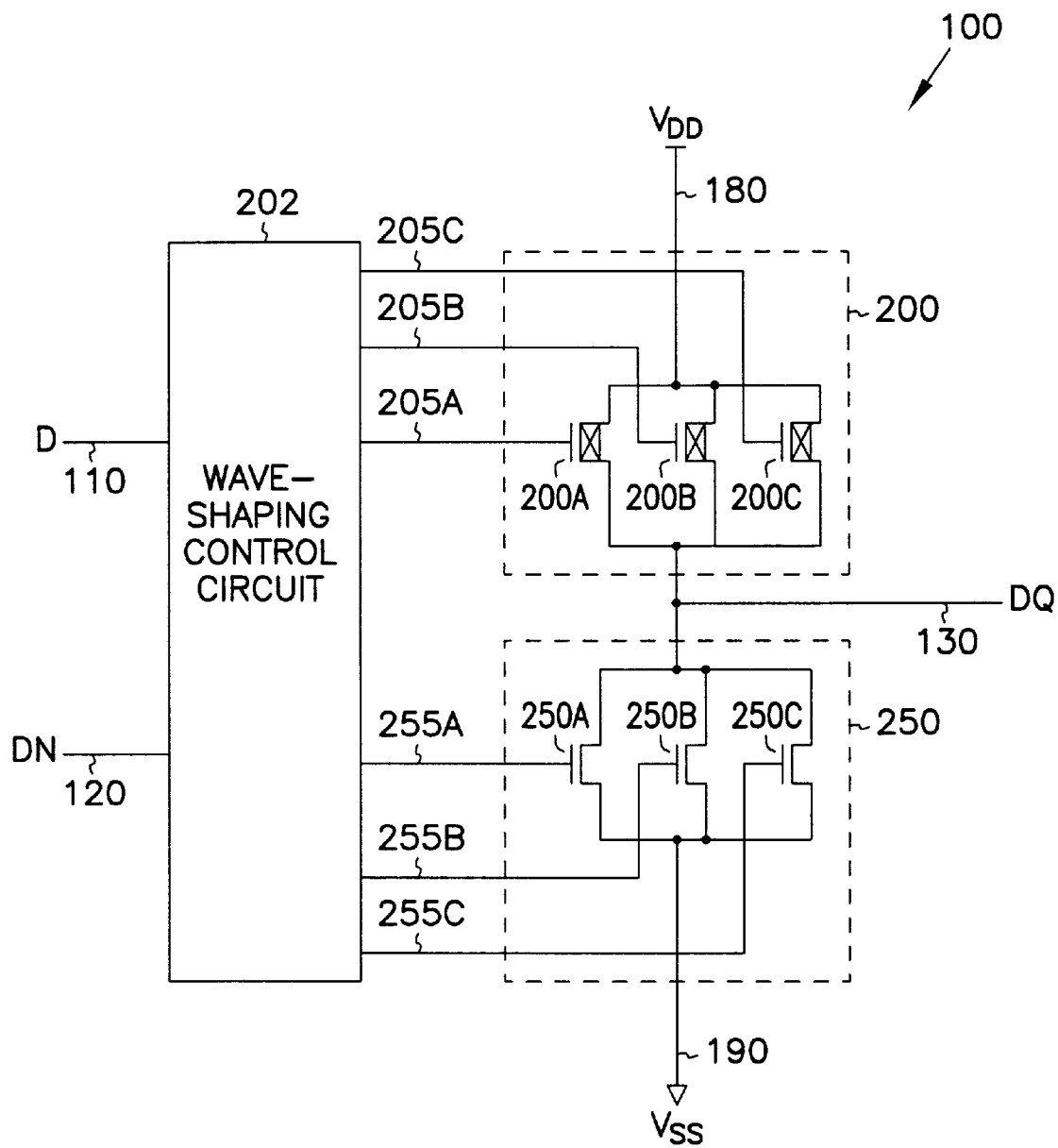
FIG. 10 is a generalized schematic illustration of an alternate embodiment of the output driver circuit in which the first and second impedances are not included.

FIG. 10 is a generalized schematic illustration that illustrates an alternate embodiment of the output driver circuit 100. In FIG. 8, first and second impedances 210 and 260, respectively, and corresponding $V_{OH}$ and $V_{OL}$ level control circuits 212 and 272, are not present. This embodiment offers slew rate and other wave-shaping of the transitions in the voltage DQ at output node 130, but does not adjust the $V_{OH}$ and $V_{OL}$ output levels by controlling impedances.

Figure 11:
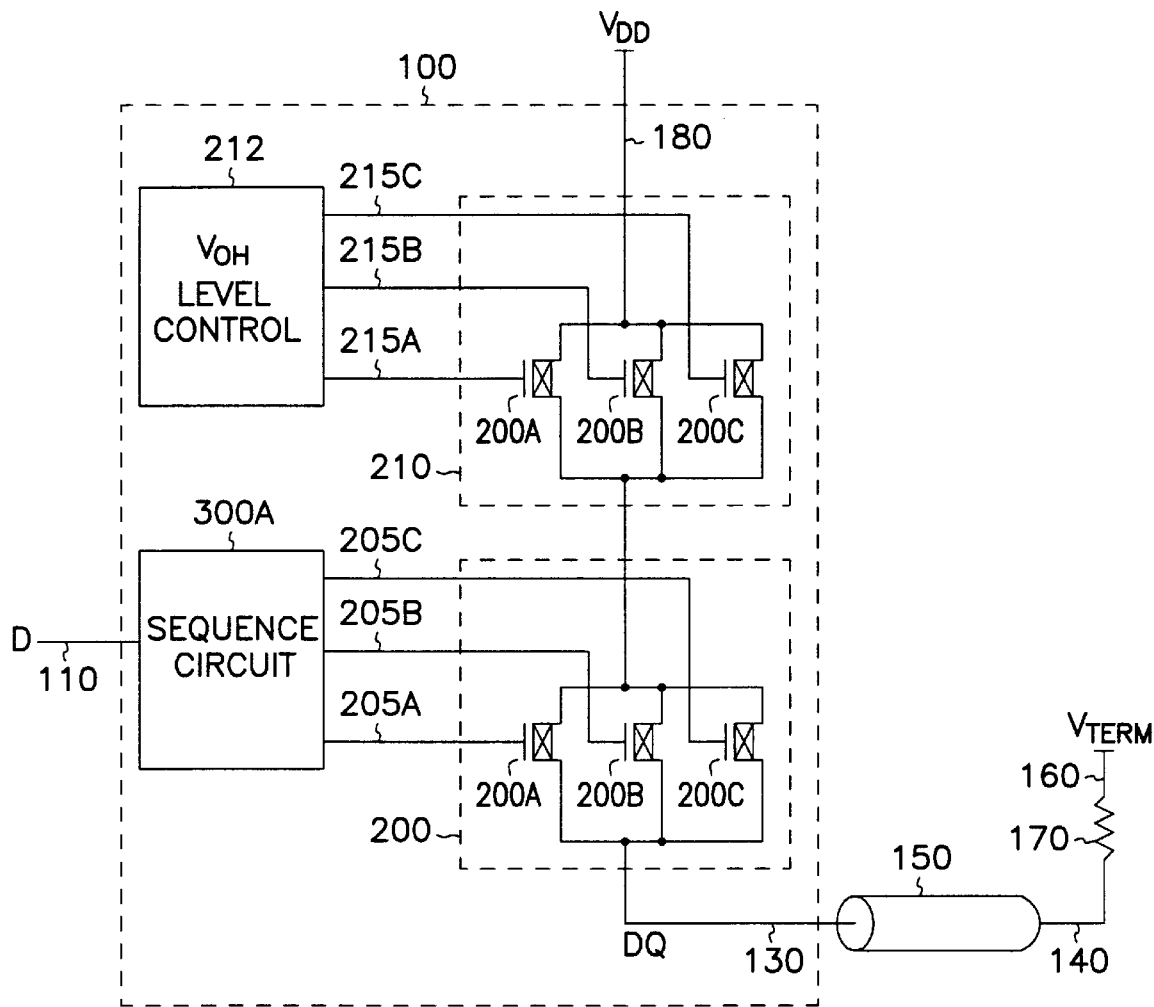
FIG. 11 is a generalized schematic illustration of an alternate embodiment of the output driver circuit for single-ended wave-shaping and binary high logic voltage level setting.

FIG. 11 is a generalized schematic illustration that illustrates a single-ended alternate embodiment of the output driver circuit 100. In FIG. 11, the second plurality 250 of output transistors and second impedance 260 are not present. This embodiment offers slew rate and $V_{OH}$ level control of the voltage DQ at output node 130; the $V_{OL}$ level is established at $V_{term}$ by the resistive connection through termination resistors 170 to the termination voltage at node 160.

Figure 12:
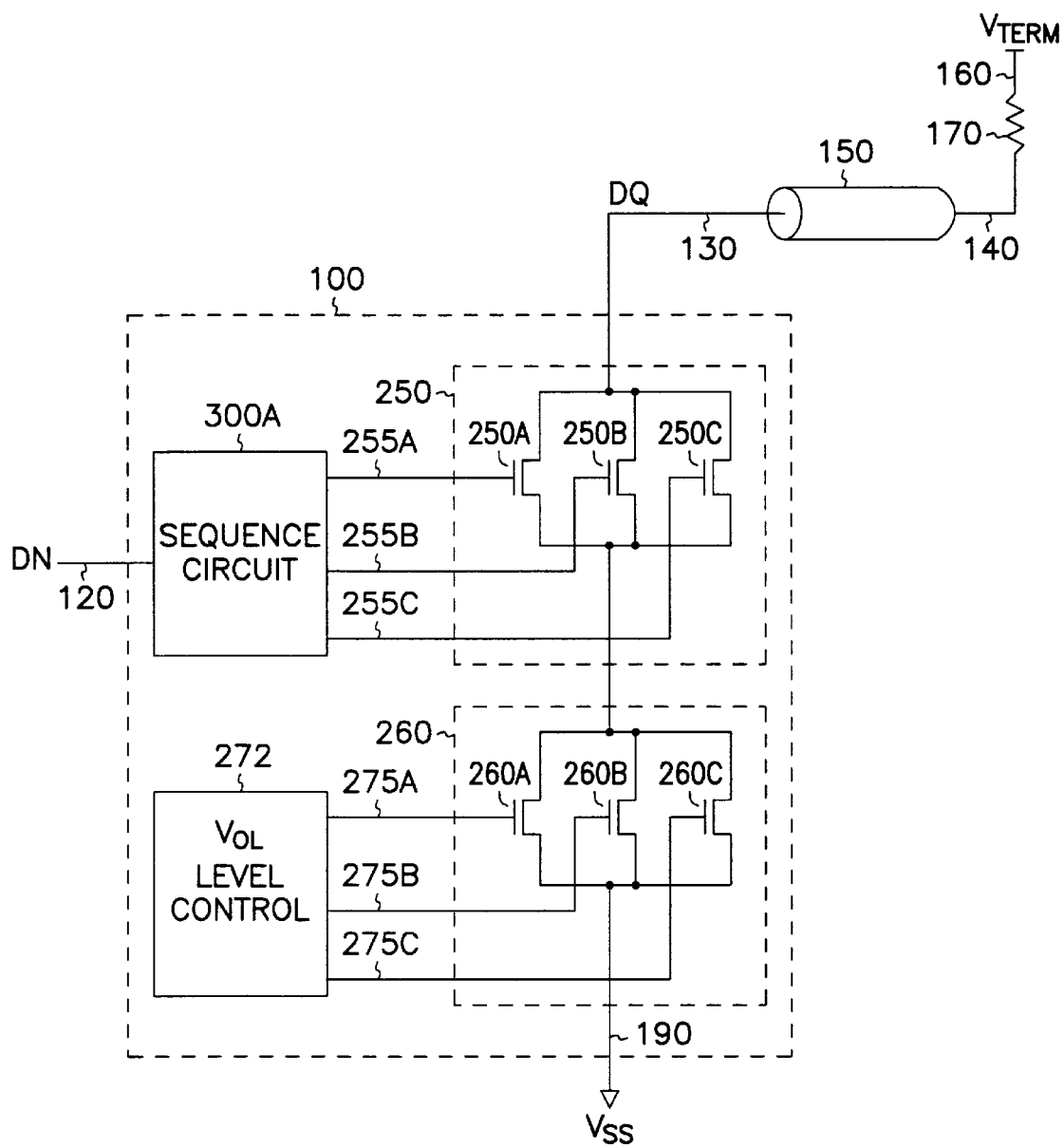
FIG. 12 is a generalized schematic illustration of an alternate embodiment of the output driver circuit for single-ended wave-shaping and binary low logic voltage level setting.

FIG. 12 is a generalized schematic illustration that illustrates another single-ended alternate embodiment of the output driver circuit 100. In FIG. 12, the first plurality 200 of output transistors and first impedance 210 are not present. This embodiment offers slew rate and $V_{OL}$ level control of the voltage DQ at output node 130; the $V_{OH}$ level is established at $V_{term}$ by the resistive connection through termination resistors 170 to the termination voltage at node 160.

Thus the present invention includes method and apparatus of wave-shaping a signal, including logic voltage levels and a slew rate of a voltage transition therebetween. The present invention is particularly useful for high speed data communications, such as in a synchronous memory including a dynamic random access memory (DRAM).

Although specific embodiments have been illustrated and described herein, it will be appreciated by those of ordinary skill in the art that any arrangement which is calculated to achieve the same purpose may be substituted for the specific embodiment shown. This application is intended to cover any combinations, adaptations, or variations of the present invention. Therefore, it is manifestly intended that this invention be limited only by the claims and the equivalents thereof.

What is claimed is:

1. An output driver circuit comprising:
a first plurality of output transistors, each having a drain terminal that is electrically coupled to an output node and a control terminal that is electrically isolated from the output node, the first plurality of output transistors electrically coupling the output node to a first power supply;
a control circuit sequentially coupled at different times to the control terminals of output transistors in the first plurality of output transistors for sequentially turning on or off the output transistors in the first plurality of output transistors at different times in response to a transition in a first input signal received by the control circuit; and
a reprogrammable first impedance between the first plurality of output transistors and the first power supply, the first impedance including a plurality of transistors that are programmed on or off to obtain the desired reprogrammable first impedance and to obtain a desired reprogrammable steady-state first logic voltage at the output node when the output node is coupled to a termination resistor.

2. The output driver circuit of claim 1, in which the first impedance includes a plurality of parallel-connected transistors having gate terminals that receive binary logic levels such that ones of the parallel-connected transistors are either on or off.

3. The output driver circuit of claim 1, further comprising:

a second plurality of output transistors each having a drain terminal that is coupled to the output node and a gate terminal that is electrically isolated from the output node, the second plurality of output transistors electrically coupling the output node to a second power supply;

wherein the control circuit is sequentially coupled at different times to the control terminals of output transistors in the second plurality of output transistors for sequentially turning on or off the output transistors in the second plurality of output transistors at different times in response to a transition in a second input signal received by the control circuit; and a reprogrammable second impedance between the second plurality of output transistors and the second power supply, the second impedance including a plurality of transistors that are programmed on or off to obtain the desired reprogrammable second impedance and to obtain a desired second logic voltage at the output node when the output node is coupled to the termination resistor.

4. The output driver circuit of claim 3, in which the second impedance includes a plurality of parallel-coupled transistors having gate terminals that receive binary logic levels such that ones of the parallel-connected transistors are either on or off.

5. An integrated circuit output driver circuit comprising:

a first plurality of output transistors including a source terminal that is electrically coupled to a first power supply, a drain terminal that is electrically coupled to an output node that is resistively terminated to a termination node that is at a substantially constant termination voltage and a control terminal that is electrically isolated from the output node;

a second plurality of output transistors including a source terminal that is electrically coupled to a second power supply a drain terminal that is electrically coupled to the output node, and a control terminal that is electrically isolated from the output node;

a control circuit sequentially coupled at different times to a control terminal of output transistors in each of the first and second plurities of output transistors for sequentially turning on or off the output transistors in the first and second pluralities of output transistors at different times in response to respective transitions in first and second input signals received by the control circuit;

a reprogrammable first impedance between the first plurality of output transistors and the first power supply, the first impedance including a plurality of transistors that are programmed on or off to obtain the desired reprogrammable first impedance and to obtain a desired reprogrammable steady-state first logic voltage at the output node when the output node is coupled to a termination resistor; and a reprogrammable second impedance between the second plurality of output transistors and the second power supply, the second impedance including a plurality of transistors that are programmed on or off to obtain the desired reprogrammable second impedance and to obtain a desired reprogrammable steady-state second logic voltage at the output node when the output node is coupled to a termination resistor.

6. The integrated circuit output driver of claim 5, in which the first impedance includes a plurality of parallel-connected transistors having gate terminals that receive binary logic levels such that ones of the parallel-connected transistors in the first impedance are either on or off, and the second impedance includes a plurality of parallel-coupled transistors having gate terminals that receive binary logic levels such that ones of the parallel-connected transistors in the second impedance are either on or off.

7. The integrated circuit output driver of claim 6, further comprising:

a first level control circuit providing binary logic levels to the gate terminals of the parallel-connected transistors in the first impedance for turning ones of the parallel-connected transistors in the first impedance on and off; and a second level control circuit providing binary logic levels to the gate terminals of the parallel-connected transistors in the second impedance for turning ones of the parallel-connected transistors in the second impedance on and off.

8. The integrated circuit output driver of claim 6, in which the output node is coupled to a termination resistor such that the output node provides steady-state logic levels that are based on: a resistive division between the resistance of the termination resistor and the first impedance, and a resistive division between the resistance of the termination resistor and the second impedance.

9. The integrated circuit output driver of claim 5, wherein the control circuit comprises a first inverter string of series-connected inverters providing sequencing signals at the control terminals of the output transistors in the first plurality of output transistors in response to the first input signal.

10. The integrated circuit output driver of claim 5, wherein the control circuit comprises a second inverter string of series-connected inverters providing sequencing signals at the control terminals of the output transistors in the second plurality of output transistors in response to the second input signal.

11. The integrated circuit output driver of claim 5, wherein the control circuit comprises a delay element circuit providing sequencing signals at the control terminals of the output transistors in the first plurality of output transistors in response to the first input signal.

12. The integrated circuit output driver of claim 11, wherein the delay element circuit provides adjustably delayed sequencing signals.

13. The integrated circuit output driver of claim 5, wherein the control circuit comprises a delay element circuit providing sequencing signals at the control terminals of the output transistors in the second plurality of output transistors in response to the second input signal.

14. The integrated circuit output driver of claim 13, wherein the delay element circuit provides adjustably delayed sequencing signals.

15. A method of providing an output data signal at a resistively terminated output node the method comprising:

receiving a first power supply;

coupling a first adjustably reprogrammable impedance to the first power supply to generate an adjustably reprogrammable steady-state first logic voltage;

receiving a first input signal at a control circuit; and sequentially coupling or decoupling the output node to the first logic voltage through output transistors in a first plurality of output transistors in response to the first input signal to obtain a desired slew rate of the output data signal, wherein sequentially coupling or decoupling the output node to the first logic voltage includes turning on individual output transistors in the first plurality of output transistors at different times in response to a transition in the first input signal.

16. The method of claim 15, further comprising:

receiving a second power supply;

coupling a second adjustably reprogrammable impedance to the second power supply to generate an adjustably reprogrammable steady-state second logic voltage;

receiving a second input signal at a control circuit; and sequentially coupling or decoupling the output node to the second logic voltage through output transistors in a second plurality of output transistors in response to the second input signal to obtain a desired slew rate of the output data signal wherein sequentially coupling or decoupling the output node to the second logic voltage includes turning on individual output transistors in the second plurality of output transistors at different times in response to a transition in the second input signal.

17. The method of claim 16, further comprising:

adjusting the first steady-state logic voltage by turning on or off ones of parallel-connected transistors forming the first impedance; and adjusting the second steady-state logic voltage by turning on or off ones of parallel-connected transistors forming the second impedance.

18. A synchronous memory device comprising:

an array of memory cells for storing data received on a data communication line;

an output driver circuit having an output node electrically coupled to the data communication line, in which the output driver provides data read from the array of memory cells, the output driver circuit comprising:

an output node that is resistively terminated to a termination node that is at a substantially constant termination voltage;

a first plurality of output transistors, each having a drain terminal that is electrically coupled to the output node and a control terminal that is electrically isolated from the output node, the first plurality of output transistors electrically coupling the output node to a first power supply;

a second plurality of output transistors, each having a drain terminal that is electrically coupled to the output node and a control terminal that is electrically isolated from the output node, the second plurality of output transistors electrically coupling the output node to a second power supply; and a control circuit sequentially coupled at different times to the control terminals of output transistors in each of the first and second pluralities of output transistors for sequentially turning on or off ones of the output transistors in the first and second pluralities of output transistors at different times in response to respective transitions in first and second input signals received by the control circuit;

a reprogrammable first impedance between the first plurality of output transistors and the first power supply, the first impedance including a plurality of transistors that are programmed on or off to obtain the desired reprogrammable first impedance and to obtain a desired first logic voltage at the output node when the output node is coupled to a termination resistor; and a reprogrammable second impedance between the second plurality of output transistors and the second power supply, the second impedance including a plurality of transistors that are programmed on or off to obtain the desired reprogrammable second impedance and to obtain a desired second logic voltage at the output node when the output node is coupled to the termination resistor.

\* \* \* \* \*